US012757735B2

(12) United States Patent
Loh et al.

(10) Patent No.: US 12,757,735 B2
(45) Date of Patent: Oct. 6, 2026

(54) INVERTED MEMORY STACK

(71) Applicant: Advanced Micro Devices, Inc., Santa Clara, CA (US)

(72) Inventors: Gabriel Loh, Bellevue, WA (US); Divya Madapusi Srinivas Prasad, Mountain View, CA (US); Girish Anant Kini, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 394 days.

(21) Appl. No.: 18/379,133

(22) Filed: Oct. 11, 2023

(65) Prior Publication Data

US 2025/0125220 A1 Apr. 17, 2025

(51) Int. Cl.
*H10W 40/73* (2026.01)
*H10B 80/00* (2026.01)
(Continued)

(52) U.S. Cl.
CPC ............ *H10W 40/73* (2026.01); *H10B 80/00* (2023.02); *H10W 90/00* (2026.01); (Continued)

(58) Field of Classification Search
CPC . H01L 23/34; H01L 23/3672; H01L 23/3677; H01L 23/373; H01L 23/3731; H01L 23/3732; H01L 23/3737; H01L 23/40; H01L 23/4012; H01L 23/427; H01L 23/46; H01L 25/03; H01L 25/043; H01L 25/0652; H01L 25/0657; H01L 25/117; H01L 25/18; H01L 2225/06513; H01L 2225/06544; H01L 2225/06589; H01L 2225/06517; H01L 2225/06541;
(Continued)

(56) References Cited

U.S. PATENT DOCUMENTS 5,561,622 A * 10/1996 Bertin ................. H01L 25/0657
257/777
2012/0146207 A1* 6/2012 Chou ...................... H01L 25/18
438/107
(Continued)

OTHER PUBLICATIONS

Agrawal, A. et al. "Xylem: Enhancing Vertical Thermal Conduction in 3D Processor-Memory Stacks," 2017 50th Annual IEEE/ACM International Symposium on Microarchitecture (MICRO), Boston, MA, USA, 2017, pp. 546-559.
(Continued)

*Primary Examiner* — Natalia A Gondarenko
(74) *Attorney, Agent, or Firm* — Patterson + Sheridan, LLP

(57) ABSTRACT

An integrated circuit die stack is disclosed that includes a digital device layer, an underlying layer, and a cooling solution. The underlying layer has a lower power consumption relative to the digital device layer. The digital device layer is disposed closer to the cooling solution. In another example, memory layers and a digital device layer are configured into a three-dimensional memory stack. The digital device layer has a first surface (side) located closest to a cooling solution and the memory layers are located on a second surface (side) of the digital device layer opposite to the first surface (side) thereof. The cooling solution is adapted to receive and dissipate heat from the digital device layer and the memory layers.

25 Claims, 6 Drawing Sheets

(51) Int. Cl.
*H10W 90/00* (2026.01)
*H10W 90/20* (2026.01)

(52) U.S. Cl.
CPC ........ *H10W 90/288* (2026.01); *H10W 90/297* (2026.01); *H10W 90/722* (2026.01)

(58) Field of Classification Search
CPC ......... H01L 24/14; H01L 24/17; H01L 24/18; H01L 24/25; H01L 24/82; H01L 24/95; H01L 24/97; H01L 23/473; H01L 23/481; H01L 23/49827; H01L 23/5226; H01L 23/5228; H01L 23/5384; H01L 23/5385; H01L 23/5389; H10B 80/00; H10W 40/20; H10W 40/73; H10W 44/209; H10W 72/012; H10W 72/075; H10W 72/29; H10W 72/50; H10W 90/00; H10W 90/20; H10W 90/22; H10W 90/26; H10W 90/28; H10W 90/288; H10W 90/297; H10W 90/401; H10W 90/701; H10W 90/722; H10W 90/724; H10W 90/726; H10W 90/735
USPC ......................................... 257/712, 686, 777
See application file for complete search history.

(56) References Cited

U.S. PATENT DOCUMENTS

| | | | | |
|---|---|---|---|---|
| 2014/0040532 | A1* | 2/2014 | Watanabe | G06F 13/1668<br>711/147 |
| 2015/0279431 | A1* | 10/2015 | Li | H01L 25/0657<br>438/109 |
| 2018/0096735 | A1* | 4/2018 | Pappu | H01L 25/18 |
| 2023/0059491 | A1* | 2/2023 | Dokania | H01L 23/36 |
| 2023/0352463 | A1* | 11/2023 | Jeng | H01L 23/5381 |
| 2025/0157987 | A1* | 5/2025 | Loh | H01L 25/0657 |

OTHER PUBLICATIONS

Healy, M. B. et al., “Design and analysis of 3D-MAPS: A many-core 3D processor with stacked memory,” IEEE Custom Integrated Circuits Conference 2010, San Jose, CA, USA, 2010, pp. 1-4.

Loh, G. H. “3D-Stacked Memory Architectures for Multi-core Processors,” 2008 International Symposium on Computer Architecture, Beijing, China, 2008, pp. 453-464.

* cited by examiner

INVERTED MEMORY STACK

TECHNICAL FIELD

Embodiments of the present disclosure generally relate to thermal management in integrated circuit die stacks and integrated circuit packaging of dynamic random-access memory (DRAM) dice, and in particular, to configurations of DRAM dice stacked in integrated circuit packages for improvements in thermal management thereof.

BACKGROUND

Dynamic random-access memory (DRAM), comprising stacked semiconductor dice, e.g., high bandwidth memory (HBM), in integrated circuit packages, face thermal challenges due to a potentially large number of layers of stacked semiconductor dice that present increasing thermal resistance for heat dissipation from the bottom of the dice stack to the cooling solution at the top of the dice stack. Typically, the majority of the power generation/consumption of a DRAM die stack comes from the bottom layer that may contain the physical electronics (PHY layer) for serializer/de-serializer (SerDes), address, read, write and refresh logic, data and address input receivers and output drivers, and DC voltage regulators. The PHY layer consists of much of the higher-activity/higher-power circuitry which, located at the bottom of the dice stack in the integrated circuit package, is furthest from a cooling solution (e.g., air cooled heat sink with fins, liquid cooling pipes, etc.), generally, at the top of the integrated circuit package. Therefore, the heat generated from the PHY layer die has to travel through the DRAM layer dice.

Excess heat in the DRAM circuitry may cause degradation in performance and require more frequent and higher refresh power to maintain the memory data contents stored therein. Currently, the main solutions dealing with high DRAM temperatures are to either throttle down in speed the memory/computer system in some way to reduce power consumption enough to reduce the amount of excess heat, and/or use of more expensive/exotic cooling solutions (e.g., liquid cooling, cold plate, immersion cooling), neither/both of which are undesirable. Another solution to ensure reliable operability of DRAM at higher temperatures is to increase the refresh rate which eventually leads to lower performance/fewer instructions per cycle (IPC) and increased power overhead.

SUMMARY

In one example of the disclosure, an integrated circuit die stack is provided that includes digital device layer, an underlying layer, and a cooling solution. The underlying layer has a lower power consumption relative to digital device layer. The digital device layer disposed closer to the cooling solution.

In another example of the disclosure, a memory stack includes a digital device layer. A cooling solution on a first side of the digital device layer. And a plurality of memory layers on a second side of the digital device layer opposite the first side thereof.

In one example of the disclosure, a memory stack includes a plurality of memory layers stacked one on top of the other. A cooling solution located at one end of the stack of the plurality of memory layers. And a first digital device layer located between two of the plurality of memory layers.

In one example of the disclosure, a memory stack includes a plurality of memory layers stacked one on top of the other. At least two digital device layers attached and electrically interconnected to the plurality of memory layers. And a cooling solution located at one end of the memory stack of the plurality of memory layers and the at least two digital device layers.

In one example of the disclosure, an electronic system includes at least one memory stack. Each memory stack includes a digital device layer, a cooling solution on a first side of the digital device layer, and a plurality of memory layers on a second side of the digital device layer opposite to the first side thereof. And system on a chip (SoC) coupled to the at least one memory stack.

BRIEF DESCRIPTION OF THE DRAWINGS

So that the manner in which the above recited features of the present invention can be understood in detail, a more particular description of the invention, briefly summarized above, may be had by reference to examples, some of which are illustrated in the appended drawings. It is to be noted, however, that the appended drawings illustrate only typical examples of this invention and are therefore not to be considered limiting of its scope, for the invention may admit to other equally effective examples.

Figure 1:
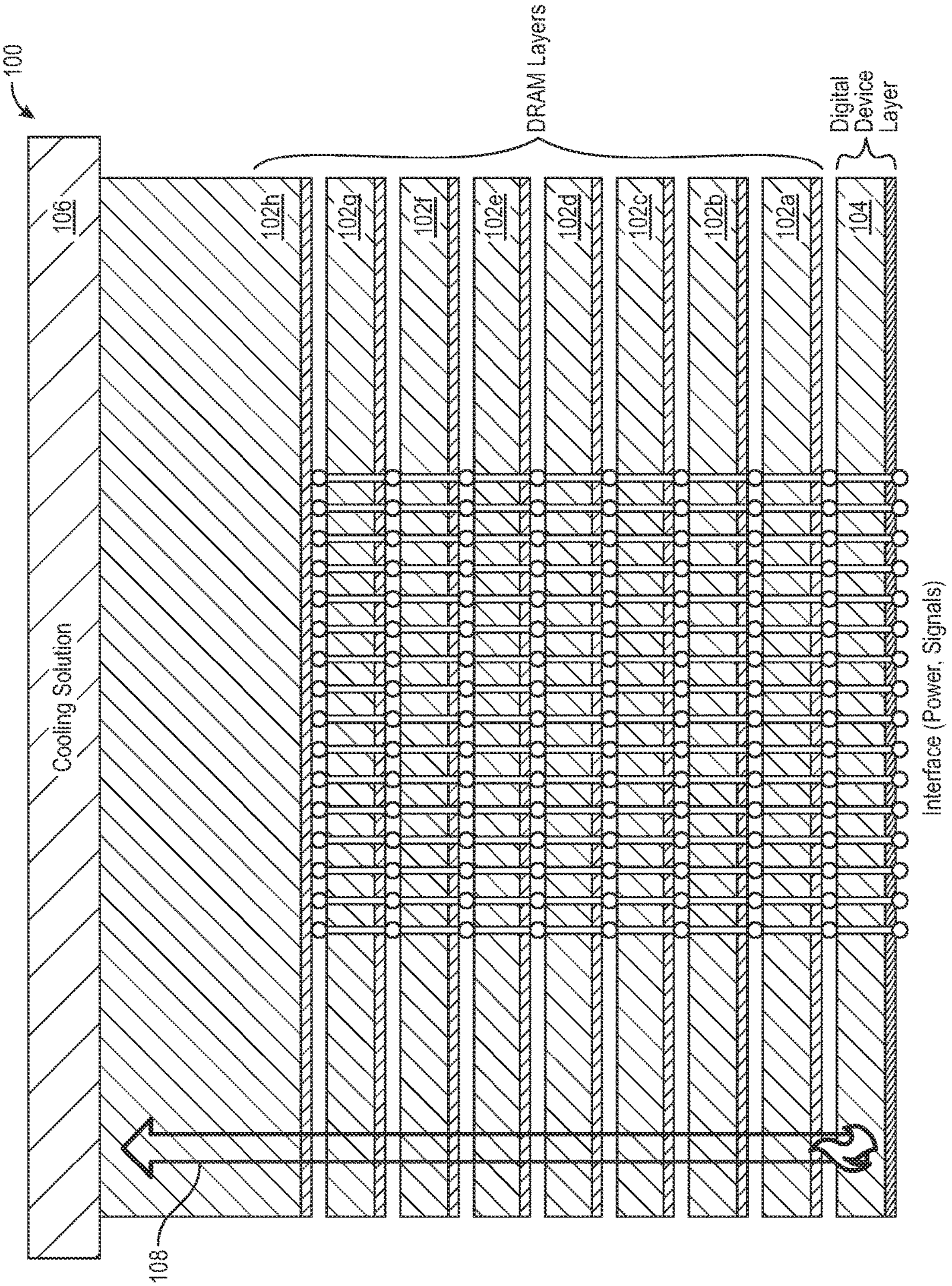
FIG. 1 (Prior Art)
FIG. 1 illustrates a representative schematic elevational cross-section layout of a prior art DRAM stack.

To facilitate understanding, identical reference numerals have been used, where possible, to designate identical elements that are common to the figures, and a lower-case letter added where the elements are substantially the same. It is contemplated that elements of one embodiment may be beneficially incorporated in other embodiments.

DETAILED DESCRIPTION

Referring to FIG. 1, depicted is a representative schematic elevational cross-section layout of a prior art DRAM stack. A three-dimensional memory stack, generally represented by the numeral 100, comprises a plurality of integrated circuit (IC) semiconductor wafer DRAM (die) layers 102 and a digital device layer 104 vertically stacked, one above another with the digital device layer 104 at the bottom of the stack of DRAM layers 102. A cooling solution 106, e.g., heat sink with fins, liquid cooling tubes, etc., may be implemented at the top of the memory stack 100, and receive and dissipate heat from the DRAM layers 102 and digital device layer 104. FIG. 1 depicts an example three-dimensional memory stack typical of present technology implementations for high capacity and speed memory, e.g., high bandwidth memory (HBM). The digital device layer 104 at the bottom consists of interface circuits to external IC package connections, e.g., primarily power delivery and memory interface signals (address, command, and data signals) to the DRAM layers 102, and may also include other circuits and connections for debug, test, control, etc., of the DRAM layers 102.

A memory interface, in particular, of the digital device layer 104 typically operates at very high speeds to achieve high data rate capacity transfer performance. Memory interface circuits operating at high data transfer rates, can consume a significant amount of power. The power consumption of the DRAM stack 100 generates heat (fire icon 108), which must then make its way up through the rest of the DRAM stack 100 to the cooling solution 106 where the heat can be removed. In an HBM for example, roughly 40 percent of the total power can be dissipated within the digital device layer 104. With an increasingly tall DRAM stack 100 (e.g., eventually 12-16 high), can lead to a sharp increase in temperature of the digital device layer 104 due to the distance and insulating properties of the DRAM layers 102 between the digital device layer 104 and the cooling solution 106. For DRAM circuits especially, this elevated temperature can impact performance (due to the need for more frequent refreshes), power consumption (again due to the need for more frequent refreshes) and reliability.

According to the teachings of this disclosure, a plurality of memory layers, e.g., DRAM, static random-access memory (SRAM), serial shift registers, eDRAM, Flash, phase-change memory, resistive RAM, ferromagnetic RAM, spin-torque transfer RAM and the like, and a digital device layer, e.g., a memory interface for address, command, and data of the plurality of memory layers may be configured in a three-dimensional memory stack. This memory stack may have the digital device layer and the plurality of memory layers inverted from the construction of the memory stack of the prior art. The inverted memory stack has a first surface (side) of the digital device layer located closest to the cooling solution and the plurality of memory layers located on a second surface (side) of the digital device layer opposite to the first surface (side) thereof. This inverted memory stack configuration substantially alleviates and/or mitigates the thermal challenges of efficiently removing heat from the digital device layer since now it is closest to the cooling solution and not being thermally insulated by the memory layers. It is contemplated and within the scope of this disclosure that one or more of the digital device layer(s), in addition to a memory interface, may comprise a microcontroller, a microprocessor, a mixed signal processor, a central processing unit (CPU), a programmable logic array (PLA), an application specific integrated circuit (ASIC), a digital signal processor (DSP), a graphics processing unit (GPU), a field programmable gate array (FPGA), neural processing unit, tensor processing unit, and the like.

Various features are described hereinafter with reference to the drawing figures. It should be noted that the drawing figures may or may not be drawn to scale and that the elements of similar structures or functions are represented by like reference numerals throughout the drawing figures. It should be noted that the drawing figures are only intended to facilitate the description of the features of the examples. They are not intended as an exhaustive description of the examples below or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described. Referring now to the drawing figures, the details of examples are representative layouts schematically illustrated. Like elements in the drawing figures will be represented by like numbers, and similar elements will be represented by like numbers with a different lower-case letter suffix.

Figure 2:
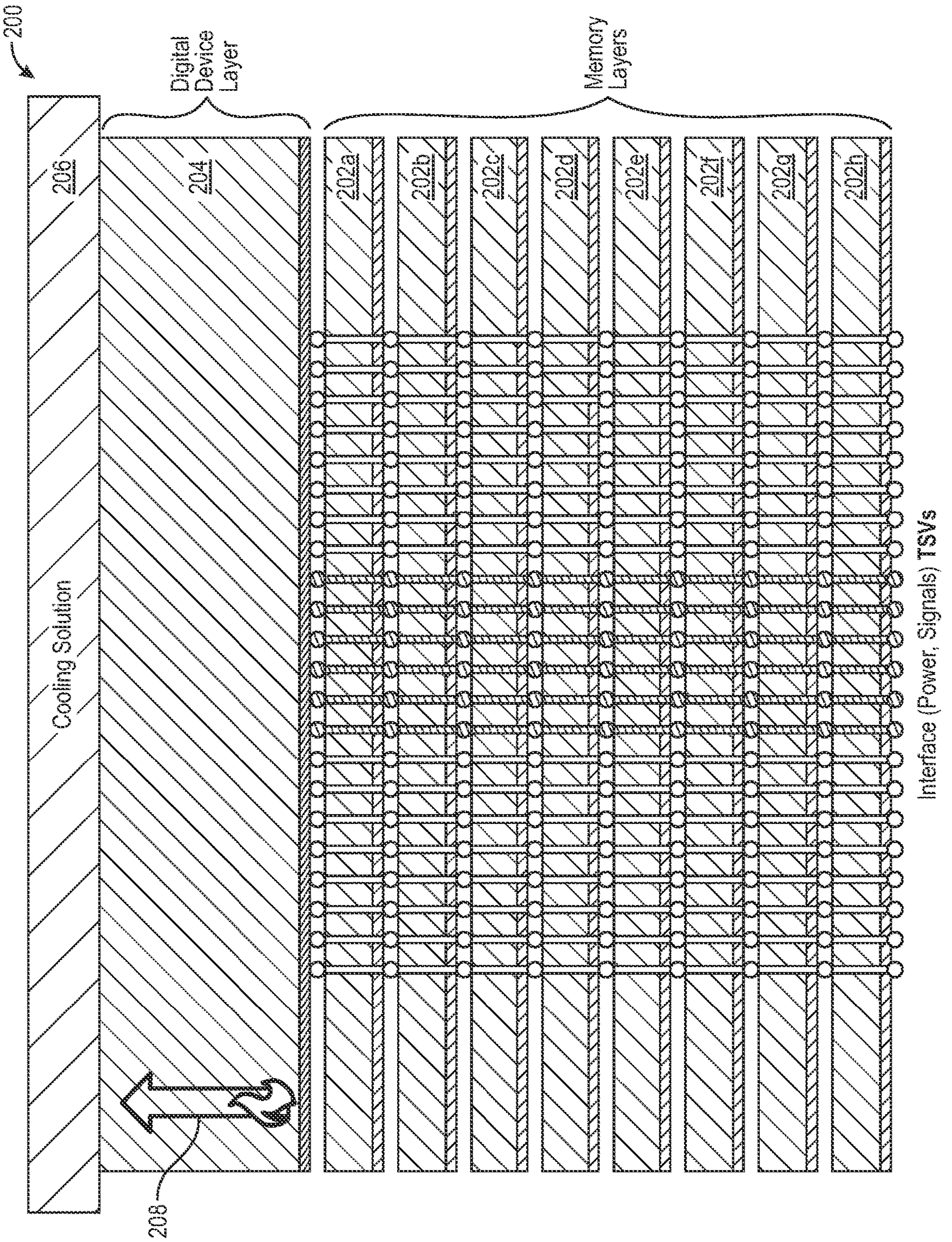
FIG. 2 illustrates a representative schematic elevational cross-section layout of a three-dimensional integrated circuit die stack, shown in one example as a memory stack having a digital device layer interposed between a cooling solution and a plurality of memory layers, according to an example.

Referring to FIG. 2, depicted is a representative schematic elevational cross-section layout of a three-dimensional integrated circuit (IC) die stack having a digital device layer interposed between a cooling solution and one or more underlying layers, according to an example. The underlying layer consumes less power, and thus generates less heat than the digital device layer. The underlying layer may be a memory IC die, an optical IC die, or a low power IC die (compared to the digital device layer. In the example depicted in FIG. 2, the IC die stack is shown as memory stack having a digital device layer interposed between a cooling solution and a plurality of memory layers. A three-dimensional memory stack, generally represented by the numeral 200, comprises a digital device layer 204, and a plurality of integrated circuit (IC) semiconductor memory (die) layers 202 vertically stacked one below another with the digital device layer 204 closest to a cooling solution 206. The cooling solution 206 may be a thermal dissipation device with heat transfer enhancement structures such as, for example but not limited to, a heat sink, a heat sink with fins, liquid cooling tubes, vapor chambers, heat pipes, cold plates and the like.

The cooling solution 206 is adapted to receive and dissipate heat from the digital device layer 204 and the plurality of memory layers 202. The digital device layer 204, proximate to the cooling solution 206, comprises interface circuits to external IC package connections, e.g., memory interface signals (address, command, and data) to the memory layers 202, and may also include other circuits and connections for debug, test, control, etc., of the plurality of memory layers 202. Power delivery to the plurality of memory layers 202 and digital device layer 204 may be provided directly from the bottom of the memory stack 200, e.g., via a subset of connections at the bottom of the memory layer 202*h*.

The higher-power dissipation circuitry (digital device layer 204) may be placed proximate to the cooling solution 206 in the memory stack 200, instead of having the plurality of memory layers 202 there between. This significantly reduces the thermal resistance between the circuitry in the digital device layer 204 and the cooling solution 206, thereby enabling the plurality of memory layers 202 to maintain lower operating temperatures. The majority of heat is generated by the digital device layer 204 and has a much shorter distance to travel to the cooling solution 206, as represented by the fire arrow 208. The digital device layer 204 die typically is not thinned (or not thinned nearly as much as the other memory layers 202) since it does not need to provide for integration of through-silicon vias (TSV). This in turn improves spreading of heat laterally by reducing thermal resistance which is also a key attribute for reducing the severity of localized semiconductor die hotspots. There are a few considerations for this organization. First, the connections from the external signal paths (address/command/data) have to be routed to the digital device layer 204 through the plurality of memory layers 202, which may require more TSVs that in turn increases the die area of each of the plurality of memory layers 202. A large increase in die area overhead is not required because only enough additional areas for signal paths are required and not for all of the power delivery (power and ground) TSVs. The power delivery TSVs already exist in the prior art DRAM stack 100 (FIG. 1) designs and will continue to exist with the same or similar area overhead for the memory stack 200 shown in FIG. 2. Power (DC and common/ground) is only required to the digital device layer 204 but not back to the plurality of memory layers 202 since the power and ground TSVs already exist in the memory layers 202. Additional TSVs are shown in the middle, but it is contemplated and within the scope of this disclosure that additional TSVs may be located anywhere, as is best suited for the integrated circuit stack design. A potentially beneficial side-effect is that the additional TSVs can further improve the vertical heat flow through the memory stack 200.

Figure 3:
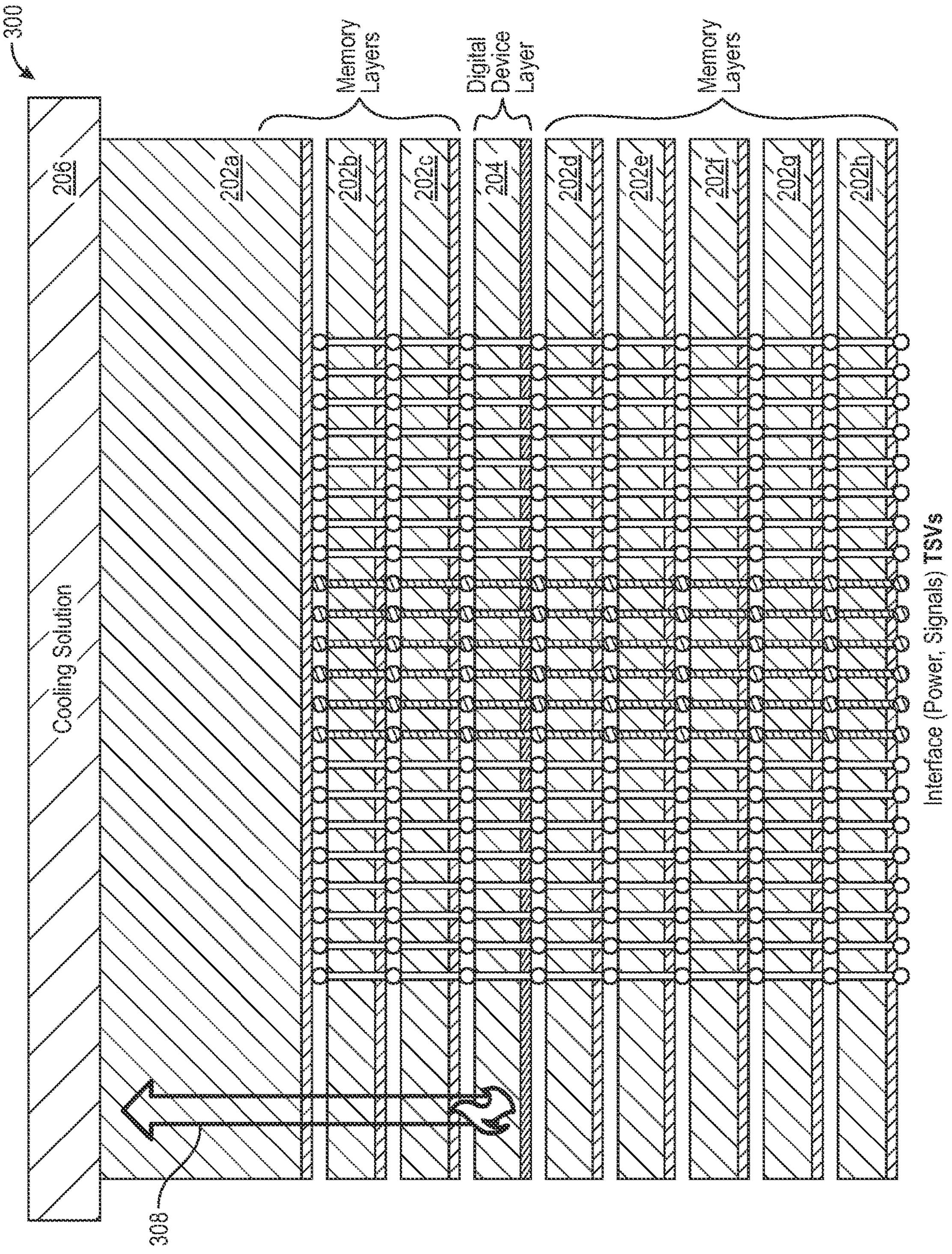
FIG. 3 illustrates a representative schematic elevational cross-section layout of a three-dimensional memory stack having a digital device layer interposed between a plurality of memory layers, according to an example.

Referring to FIG. 3, depicted is a representative schematic elevational cross-section layout of a three-dimensional memory stack having a digital device layer interposed between a plurality of memory layers, according to an example. A three-dimensional memory stack, generally represented by the numeral 300, comprises a digital device layer 204 and a plurality of integrated circuit (IC) semiconductor memory (die) layers 202 stacked together. At least one of the plurality of memory layers 202 is located between the digital device layer 204 and a cooling solution 206. The digital device layer 204 is located between at least two of the plurality of memory layers 202. Locating of the digital device layer 204 between the plurality of memory layers 202 provides for some tradeoffs between how far the digital device layer 204 is from the cooling solution 206, at the top of the memory stack 300, and from the bottom where external interfacing of signal connections are located. Where signal integrity is critical, being closer to the external integrated circuit (IC) package signal connections may take presentence over optimal cooling performance of the memory stack 300. This may somewhat increase the distance that the heat generated by the digital device layer 204 has to travel to the cooling solution 206, as represented by the fire arrow 308. Operating the digital device layer 204 at a reduced voltage (lower power dissipation) may help offset the increased thermal resistance (poorer heat flow) caused by the digital device layer 204 having at least one of the plurality of memory layers 202 between it and the cooling solution 206.

Figure 4:
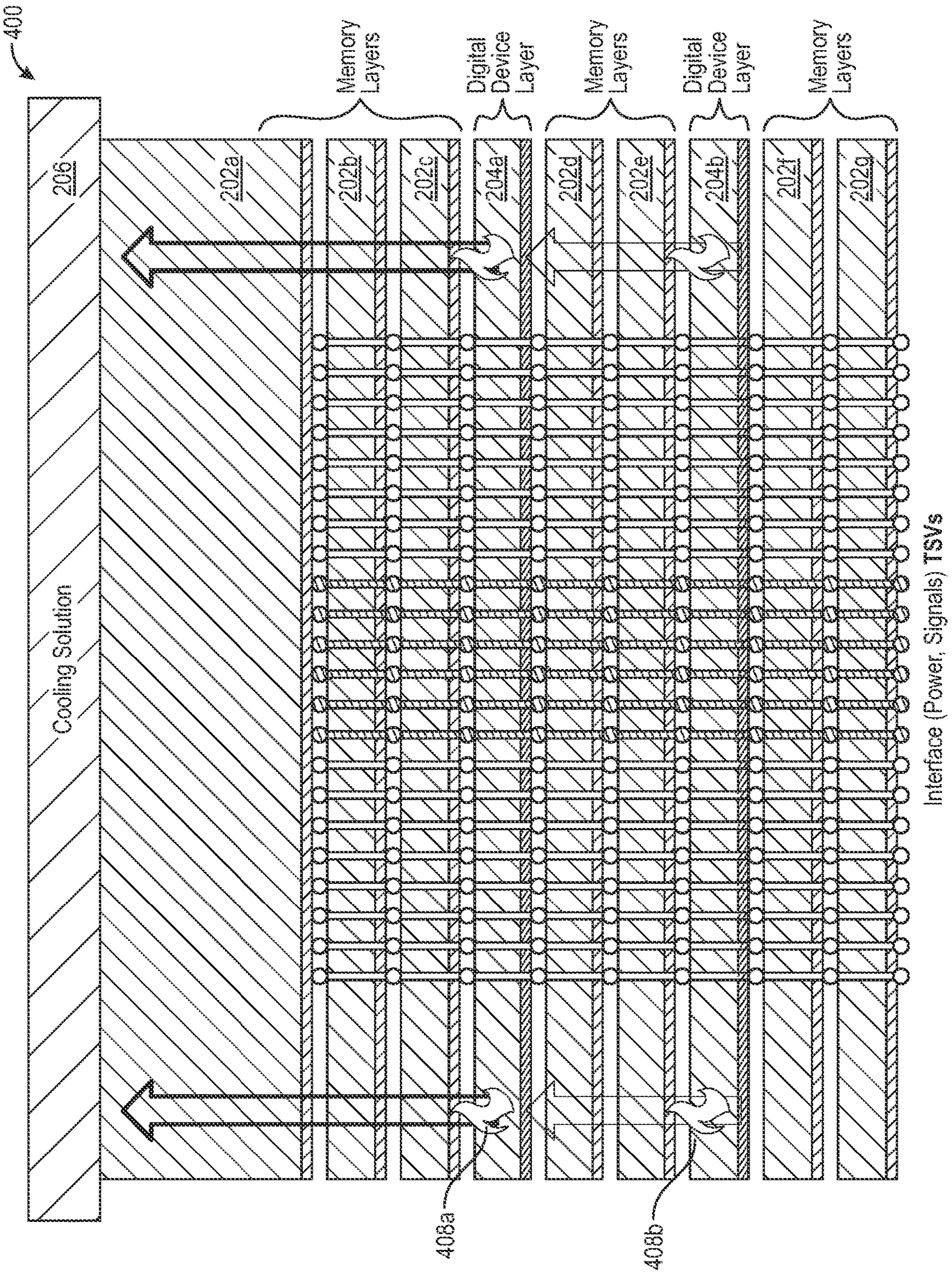
FIG. 4 illustrates a representative schematic elevational cross-section layout of a three-dimensional memory stack having at least two digital device layers and a plurality of memory layers, according to an example.

Referring to FIG. 4, depicted is a representative schematic elevational cross-section layout of a three-dimensional memory stack having at least two digital device layers, according to an example. A three-dimensional memory stack, generally represented by the numeral 400, comprises at least two digital device layers 204 and a plurality of integrated circuit (IC) semiconductor memory (die) layers 202 stacked together. The at least two digital device layers 204 may be placed at various locations in the memory stack 400 relative to the plurality of memory layers 202. For example, at least one of the at least two digital device layers 204*a* may be located: 1) at an intermediate position in the plurality of memory layers 202; 2) between the plurality of memory layers 202 and the cooling solution 206; or 3) the plurality of memory layers 202 located between the cooling solution 206 and the at least one of the at least two digital device layers 204*a*. At least one other of the at least two digital device layers 204*b* may be located: 4) at another intermediate position in the plurality of memory layers 202; 5) between the plurality of memory layers 202 and the cooling solution 206; 6) the plurality of memory layers 202 located between the cooling solution 206 and the at least one other of the at least two digital device layers 204*b;* 7) the at least one of the at least two digital device layers 204*a* may be located between the at least one other of the at least two digital device layers 204*b* and the cooling solution 204; 8) the at least one other of the at least two digital device layers 204*b* may be located between the at least one of the at least two digital device layers 204*a* and the cooling solution 204; or 9) the at least one and the at least one other of the at least two digital device layers 204*a*, 204*b* may be located next to each other.

Flexibility in the selection of the locations for the at least two digital device layers 204 enables optimizing the thermal implications for better distribute of heat generated by the at least two digital device layers 204 and may allow for a more even thermal profile of the memory stack 400. This provides for some tradeoffs between how far the at least two digital device layers 204 are from the cooling solution 206, at one end of the memory stack 400, and from the other end of the memory stack 400 where external interfacing of signal connections are located. Where signal integrity is critical, being closer to the external integrated circuit (IC) package signal connections may take precedence over optimal cooling performance of the memory stack 400. This may somewhat increase the distance that the heat generated by the at least two digital device layers 204 has to travel to the cooling solution 206, as represented by the fire arrows 408. Operating the at least two digital device layers 204 at a reduced voltage (lower power dissipation) may help offset the increased thermal resistance (poorer heat flow) caused by the at least two digital device layers 204 having some memory layers 202 located between them and the cooling solution 206.

Figure 5:
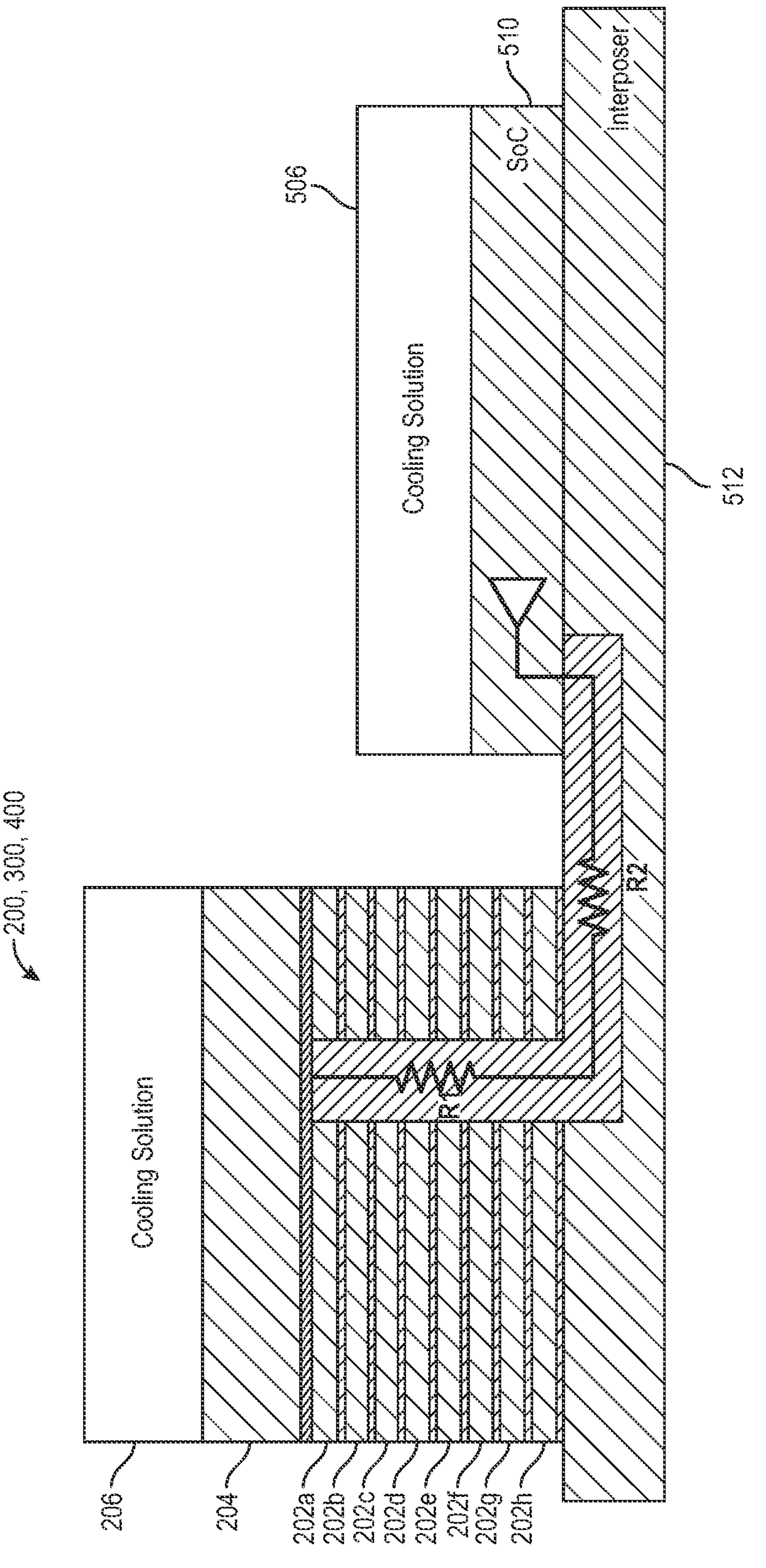
FIG. 5 illustrates a representative schematic elevational cross-section layout of the three-dimensional memory stack shown in FIG. 2, 3 or 4 and a complex electronic device interconnected thereto, according to an example.

Referring to FIG. 5, depicted is a representative schematic elevational cross-section layout of the three-dimensional memory stack shown in FIG. 2, 3 or 4 and a complex electronic device interconnected thereto, according to an example. Interconnections may be made with, for example but not limited to, an interposer substrate or other similar interconnective substrate such as integrated fan-out (InFO), wafer level packaging, embedded multi-die interconnect bridge (EMIB), elevated fan-out bridge (EFB) and the like. Typically, the external signal and power connections of the memory stack 200, 300, 400 (FIG. 2 is shown as being representative also of the memory stacks of FIGS. 300 and 400) may be coupled to an complex electronic device, e.g., interposer substrate 512, that may also be adapted for coupling to at least one other integrated circuit (IC) such as, for example but not limited to, a system on a chip (SoC) 510 such as CPU, GPU, FPGA, neural processing unit, tensor processing unit, a mixed signal microprocessor and microcontroller. However, the additional TSVs (represented by R1) and conductors on the interposer substrate (represented by R2) between the signal paths from the digital device layer 204 to the IC 510 circuitry could potentially decrease signal integrity due to the increased signal path resistances (impedances R1+R2). However, this problem may be compensated by, for example but is not limited to, adding more signal TSVs in parallel to reduce the series impedance (R1). The needed conductivity of the interposer conductors (R2) is easier to design for.

Figure 6:
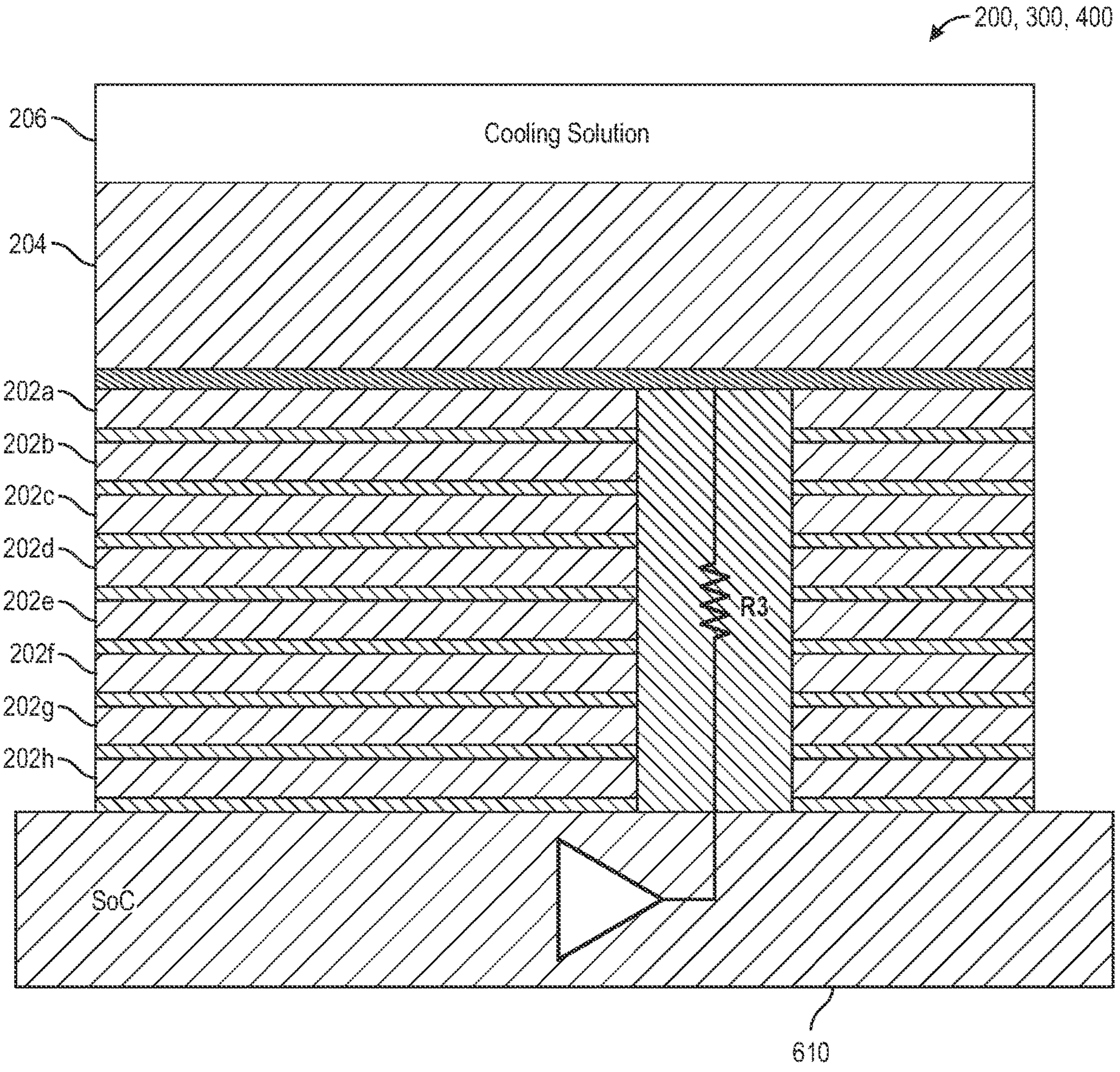
FIG. 6 illustrates a representative schematic elevational cross-section layout of the three-dimensional memory stack shown in FIG. 2, 3 or 4 and a complex electronic device layer coupled to the three-dimensional memory stack, according to an example.

Referring to FIG. 6, depicted is a representative schematic elevational cross-section layout of the three-dimensional memory stack shown in FIG. 2, 3 or 4 and a complex electronic device layer coupled to the three-dimensional memory stack, according to an example. The memory stack 200, 300, 400 (FIG. 2 is shown as being representative also of the memory stacks of FIGS. 300 and 400) may be coupled directly to a complex electronic device layer such as, for example but not limited to, a system on a chip (SoC) 610 such as a such as CPU, GPU, FPGA, neural processing unit, tensor processing unit, a mixed signal microprocessor and microcontroller. By doing so the resistance R3 (impedance) of the signal paths between the digital device layer 204 and the SoC 610 are reduced, thus improving signal integrity. Other signal path technologies may eliminate requirements for TSVs when directly coupling the memory stack to the SoC 610, further increasing system performance.

It is contemplated and within the scope of this disclosure the memory layers 202 and digital device layer(s) may be electrically coupled together using micro-bump or micro-pillar stacking technologies. In addition, other types of memory technologies and/or other types of connection/stacking technologies, e.g., hybrid bonding, may be used. Similarly, TSVs may be coupled to external connections on the interposer 512.

Preliminary analysis demonstrates that moving the digital device layer 204 closer to the cooling solution 206 provides significant thermal benefits as shown in the table below.

| | Memory stack figure | | |
|---|---|---|---|
| | FIG. 1 | FIG. 2 | FIG. 3 |
| Hotspot temperature (° C.) | 99.8 | 82.2 | 88.4 |
| Stack thermal resistance (C/W) | 0.95 | 0.35 | 0.6 |

As will be appreciated by one skilled in the art and having the benefit of this disclosure, the embodiments disclosed herein may be embodied as a system, method, apparatus, or computer programmed product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

While the foregoing is directed to embodiments of the present invention, other and further embodiments of the invention may be devised without departing from the basic scope thereof, and the scope thereof is determined by the claims that follow.

What is claimed:

1. An integrated circuit (IC) die stack, comprising:

a first digital device layer;

a cooling solution on a first side of the first digital device layer;

an underlying layer on a second side of the digital device layer opposite the first side thereof, the underlying layer having lower power consumption relative to digital device layer, the underlying layer comprising a plurality of memory layers that are electrically interconnected to the first digital device layer within the IC die stack; and a second digital device layer disposed between two of the plurality of memory layers.

2. The IC die stack according to claim 1, wherein the first and second digital device layers and the plurality of memory layers are electrically interconnected with through-silicon vias (TSVs).

3. The IC die stack according to claim 2, wherein the TSVs are adapted for coupling to external connections.

4. The IC die stack according to claim 3, wherein the external connections are adapted for coupling to an interposer substrate.

5. The IC die stack according to claim 4, further comprising a system on a chip (SoC) attached to the interposer substrate and adapted for coupling through the external connections and TSVs to the first and second digital device layers and plurality of memory layers.

6. The IC die stack according to claim 1, wherein the first and second digital device layers are a memory interface layer.

7. The IC die stack according to claim 1, wherein the first and second digital device layers are selected from the group consisting of a microcontroller layer, a microprocessor layer, a mixed signal processor layer, a central processing unit (CPU) layer, a programmable logic array (PLA) layer, an application specific integrated circuit (ASIC) layer, a digital signal processor (DSP) layer, a graphics processing unit (GPU) layer, a field programmable gate array (FPGA) layer, a neural processing unit layer, and a tensor processing unit layer.

8. The IC die stack according to claim 1, further comprising a system on a chip (SoC) attached to a first memory layer of the plurality of memory layers, and wherein the first memory layer is farthest from the cooling solution.

9. The IC die stack according to claim 1, wherein the cooling solution is a thermal dissipation device with heat transfer enhancement structures selected from the group consisting of a heat sink, a heat sink with fins, liquid cooling tubes, vapor chambers, heat pipes, cold plates.

10. A memory stack, comprising:

a plurality of memory layers stacked one on top of another;

a cooling solution located at one end of the memory stack of the plurality of memory layers;

a first digital device layer located between a first two of the plurality of memory layers; and a second digital device layer located between a second two of the plurality of memory layers.

11. The memory stack according to claim 10, wherein the digital device layers and the plurality of memory layers are electrically interconnected.

12. The memory stack according to claim 11, wherein the digital device layers and the plurality of memory layers are electrically interconnected with through-silicon vias (TSVs).

13. The memory stack according to claim 12, wherein the TSVs are adapted for coupling to external connections.

14. The memory stack according to claim 13, wherein the external connections are adapted for coupling to an interposer substrate.

15. The memory stack according to claim 14, further comprising a system on a chip (SoC) attached to the interposer substrate and adapted for coupling through the external connections and TSVs to the digital device layers.

16. The memory stack according to claim 10, wherein the first and second digital device layers are memory interface layers.

17. The memory stack according to claim 10, wherein the first and second digital device layers are selected from the group consisting of a microcontroller layer, a microprocessor layer, a mixed signal processor layer, a central processing unit (CPU) layer, a programmable logic array (PLA) layer, an application specific integrated circuit (ASIC) layer, a digital signal processor (DSP) layer, a graphics processing unit (GPU) layer, a field programmable gate array (FPGA) layer, a neural processing unit layer, and a tensor processing unit layer.

18. A memory stack, comprising:
- a plurality of memory layers stacked one on top of another;
- at least two digital device layers separately interleaved with and electrically interconnected to the plurality of memory layers; and
- a cooling solution located at one end of the memory stack of the plurality of memory layers and the at least two digital device layers.

19. The memory stack according to claim 18, wherein the at least two digital device layers are located between the cooling solution and any one or more of the plurality of memory layers.

20. The memory stack according to claim 18, wherein at least one of the plurality of memory layers are located between an end of the memory stack opposite the cooling solution and the at least two digital device layers.

21. The memory stack according to claim 18, wherein at least one of the plurality of memory layers is located between the cooling solution and the at least two digital device layers.

22. The memory stack according to claim 18, wherein the at least two digital device layers are selected from the group consisting of a memory interface layer, a microcontroller layer, a microprocessor layer, a mixed signal processor layer, a central processing unit (CPU) layer, a programmable logic array (PLA) layer, an application specific integrated circuit (ASIC) layer, a digital signal processor (DSP) layer, a graphics processing unit (GPU) layer, a field programmable gate array (FPGA) layer, a neural processing unit layer, and a tensor processing unit layer.

23. An electronic system, comprising:
- at least one memory stack, each comprising
  - a first digital device layer,
  - a cooling solution on a first side of the first digital device layer,
  - a second digital device layer, and
  - a plurality of memory layers having at least a first memory layer and a second memory layer, the first memory layer disposed between the first digital layer and the cooling solution, the second memory layer disposed between the first and second digital layers; and
- a system on a chip (SoC) electrically coupled to the at least one memory stack.

24. The electronic system according to claim 23, wherein the first digital device layer is selected from the group consisting of a memory interface layer, a microcontroller layer, a microprocessor layer, a mixed signal processor layer, a central processing unit (CPU) layer, a programmable logic array (PLA) layer, an application specific integrated circuit (ASIC) layer, a digital signal processor (DSP) layer, a graphics processing unit (GPU) layer, a field programmable gate array (FPGA) layer, a neural processing unit layer, and a tensor processing unit layer.

25. The electronic system according to claim 23, further comprising:
- an interposer substrate attached to the at least one memory stack; and
- the SoC attached to the interposer substrate and electrically coupled to the at least one memory stack through the interposer substrate.

* * * * *